United States Patent [19]

Bell

[11] Patent Number: 5,642,075

[45] Date of Patent: Jun. 24, 1997

[54] SAMPLED DATA AUTOMATIC GAIN CONTROL

[75] Inventor: Andrew G. Bell, Fort Wayne, Ind.

[73] Assignee: ITT Corporation, New York, N.Y.

[21] Appl. No.: 576,582

[22] Filed: Dec. 21, 1995

[51] Int. Cl.[6] .................................................. H03G 3/30
[52] U.S. Cl. .................................. 330/129; 330/279
[58] Field of Search ............................ 330/129, 133, 330/136, 140, 278, 279, 280

[56] References Cited

U.S. PATENT DOCUMENTS 4,360,787  11/1982  Galpin .......................... 330/279 X
5,504,457   4/1996  Jenen ............................ 330/129

OTHER PUBLICATIONS

"Solution AGC", by F. Baumbartner, 73 Amateur Radio, Sep. 1990.

"Automatic Conditioning of Speech Signals":, by G. Hellworth et al., IEEE Transactions on Audio and Electroacoustics, vol. AU–16, No. 2, Jun. 1986.

*Primary Examiner*—Steven J. Mottola
*Attorney, Agent, or Firm*—Plevy & Associates

[57] ABSTRACT

An amplifier circuit employing automatic gain control (AGC), with the gain responsive to a varying input signal level, and particularly adapted for manufacture as an integrated circuit. In a preferred embodiment, an error voltage is produced which is indicative of the difference between the RMS output voltage of the amplifier and a target RMS voltage. A ramp generator generates a ramp voltage in accordance with a digital count generated by a ripple counter. A comparator then produces a control signal in accordance with the difference between the ramp voltage and the error voltage. When the control signal is indicative of the amplifier output voltage differing from the target voltage, the gain is updated in accordance with the digital count and the count and ramp voltage are reset.

20 Claims, 8 Drawing Sheets

| Vin AMPLITUDE | A/D OUTPUT | PGA 12 GAIN |
| --- | --- | --- |
| Vin > A2 | 11 | G1 |
| A1 < Vin < A2 | 10 | G2 |
| Vin < A1 | 01 | G3 |

*FIG. 2*

SAMPLED DATA AUTOMATIC GAIN CONTROL

FIELD OF THE INVENTION

The present invention relates generally to automatic gain control (AGC) circuits and more particularly, to an AGC circuit for audio frequencies employing a digitally controlled output stage amplifier.

BACKGROUND OF THE INVENTION

Automatic gain control is a well known technique for controlling the gain of an amplifier in accordance with the amplitude of the incoming input signal. AGC is widely used in radio and television receivers, as well as for controlling the amplitude of pure audio signals, as in hearing aids or microphone leveling circuits. A variety of AGC circuits have been developed in the prior art which control gain by varying either feedback resistance, amplifier bias or other circuit parameters.

One well known method of varying the gain of a bipolar transistor amplifier is to vary the DC emitter current. The power gain of a common emitter or common base amplifier rises to a maximum as the emitter current increases to a certain level, with the gain then falling as the emitter current rises past that level. Thus by automatically controlling the emitter current, automatic gain control is achieved. Another method of controlling the gain involves automatic control of the DC collector voltage. As collector voltage increases, so does the gain, until a saturation collector voltage is reached whereupon further increase in the collector voltage results in decreased gain.

In AGC circuits employing operational amplifiers, a common technique for controlling gain is to employ a variable resistor in a feedback loop. By detecting the input or output voltage in some manner and varying the feedback resistor in accordance with the detected voltage, the gain is controlled. An example of such an arrangement is presented in an article entitled "Solution AGC", by F. Baumbarmer, 73 Amateur Radio, Sept. 1990. The circuit disclosed therein utilizes an LED coupled to the op-amp output, which generates increased light intensity as the output voltage increases. A photoresistor in the op-amp feedback loop then detects the light output, thereby decreasing its resistance and hence the op-amp gain. This circuit operates as a microphone leveling circuit which enables a person to speak into a microphone standing a considerable distance away from it, while achieving substantially the same performance as if speaking directly into it.

An example of a prior art AGC circuit particularly adapted to control speech signals can be had by reference to an article entitled "Automatic Conditioning of Speech Signals", by G. Hellworth et al., IEEE Transactions on Audio and Electroacoustics, Vol. AU-16, No. 2, June 1968. In this article, an AGC circuit is disclosed employing a feedback loop which controls a variable resistor that is in shunt between the amplifier input and ground. The variable resistor is embodied as a saturated symmetrical transistor operating without collector bias. The value of this variable resistor is determinative of the gain. In the feedback loop, the output voltage is fed to a full-wave rectifier and the rectified output is then compared to a fixed voltage threshold. When the output voltage exceeds the threshold, a current source produces current pulses which, by means of control circuitry, are operable to reduce the variable feedback resistance and thereby reduce the gain. When the output voltage is below the threshold, a constant current source charges a capacitor in the feedback loop to produce a voltage which causes the variable resistance to increase, thereby increasing the gain.

In any event, one common problem with the approaches discussed above as well as with other prior art AGC loops, is that they are not particularly suitable for complete fabrication within a single integrated circuit chip. Some designs are totally discrete and would require the use of many parts to build the AGC loop. More integrated designs would use fewer parts but would still require an excessively large circuit board area for the circuits. Moreover, other prior art AGC designs draw excessive power or are overly sensitive to ambient temperature changes.

It is therefore an object of the present invention to provide an automatic gain control circuit that is particularly suitable for fabrication as a relatively simple integrated circuit.

It is another object of the present invention to provide such an AGC circuit that exhibits low power dissipation and improved temperature stability.

SUMMARY OF THE INVENTION

The present invention relates to an amplifier circuit employing automatic gain control (AGC), with the gain responsive to a varying input signal level, and particularly adapted for manufacture as an integrated circuit. In a preferred embodiment, an error voltage is produced which is indicative of the difference between the RMS output voltage of the amplifier and a target RMS voltage. A ramp generator generates a ramp voltage corresponding to a digital count generated by a ripple counter. A comparator then produces a control signal in accordance with the difference between the ramp voltage and the error voltage. When the control signal is indicative of the amplifier output voltage differing from the target voltage, the gain is updated in accordance with the digital count, and the count and the ramp voltage are then reset.

BRIEF DESCRIPTION OF THE FIGURES

For a full understanding of the present invention, reference is made to an exemplary embodiment thereof, considered in conjunction with the accompanying drawings, in which:

FIG. 2 illustrates the gain control of the PGA 12 of FIG. 1;

Like reference numerals used in the several figures designate like elements.

DETAILED DESCRIPTION OF THE PREFERRED EMBODIMENT

Figure 1:
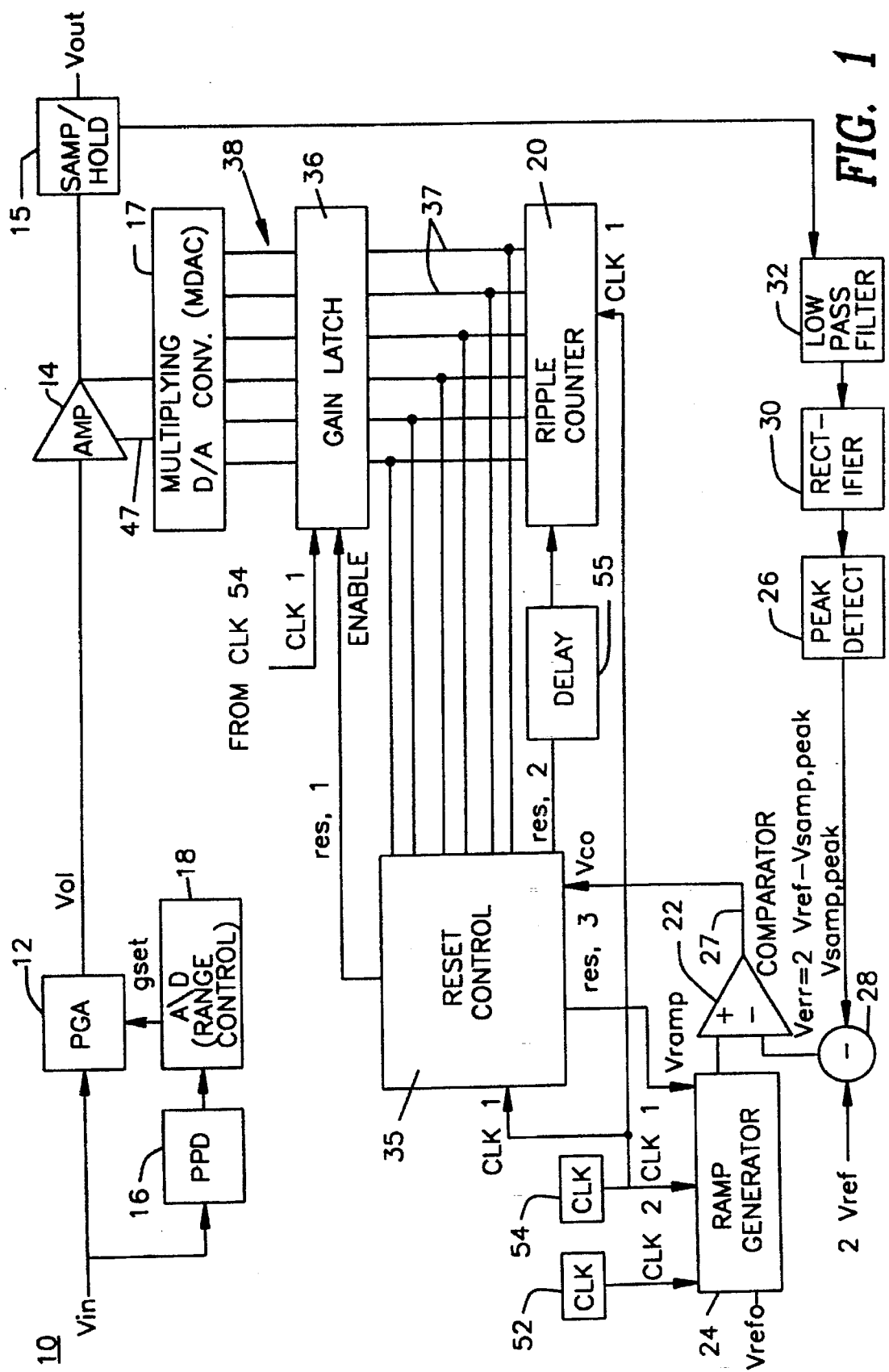
FIG. 1 shows a block diagram of an automatic gain control circuit according to the present invention.

Referring to FIG. 1, an exemplary embodiment of an automatic gain control circuit 10 according to the present invention is presented in block diagram form. As will be explained, the AGC circuit 10 adjusts its gain to produce an output signal Vout having a substantially constant RMS amplitude for every input signal level within a predetermined dynamic range.

Operation of the AGC circuit 10 is as follows. An input analog audio signal designated Vin is applied to a programmable gain amplifier (PGA) 12 and to a positive peak detector (PPD) 16. The peak detector 16 determines the peak value of the input signal Vin, which peak value is supplied to a range control circuit 18. The range control circuit 18 is an analog to digital (A/D) converter that converts the analog peak value input from the PPD 16 to a digital control word, designated "gset", which is provided to the PGA 12. The PGA 12 amplifies the input signal Vin at a gain that is determined from the gset signal. Integrated circuit programmable gain amplifiers which provide gain as a function of a digital control word are known in the art; thus, the detailed circuitry of PGA 12 will not be elaborated upon further.

In the preferred embodiment, the range control 18 is a two bit A/D converter which provides three separate gain bands corresponding to gset words of 01, 10 and 11. This is illustrated in FIG. 2. When the input signal Vin is above a predetermined threshold A2, the gset signal is "11" and a lowest gain G1 is provided by the PGA 12. When Vin is of an intermediate level, i.e., between threshold A1 and A2, gset is "10" and an intermediate gain G2 results. A maximum gain G3 results when gset equals "01", which occurs when the input signal Vin is below the threshold A2. It shall be understood, of course, that more than two bits can be utilized in the A/D conversion of the range control 18 to provide a larger number of distinct gain bands, if so desired.

The amplified output of the PGA 12, designated "Vo1", is applied to the input terminal of an output amplifier 14, which amplifies Vo1 to produce at the amplifier output terminal, the output signal of the circuit, Vout. The objective of the circuit 10 is for Vout to have a constant RMS amplitude, regardless of the value of the input signal Vin or the intermediate signal Vo1. As will be explained, the gain of amplifier 14 is a function of a digital count generated by a ripple counter 20, wherein the count, and hence the gain, are continually adjusted in accordance with the amplitude level of Vout.

Initially, the gain of amplifier 14 is at a predetermined initial gain value $G_{oo}$ This produces Vout at a voltage level equal to $G_{oo} \times Vo1$. For the sake of illustration, we will assume that the target amplitude level, for Vout is 0.707 V RMS, which corresponds to 1.0 V peak for a sinusoidal output signal. The output Vout would not be sinusoidal if it represents a pure speech signal unaccompanied by a carrier, as in hearing aid and other applications; however, a sinusoidal output is assumed for illustration purposes. The output signal Vout is sampled by a sample and hold circuit 15 and then the sample is filtered by means of a switched capacitor low pass filter 32. The output of the filter 32 is applied to a rectifier circuit 30 which provides full wave rectification of the filtered output signal sample. The rectified signal is then applied to a peak detecting circuit 26 which provides a d.c. output voltage designated Vsamp, peak equalling the peak voltage of the rectified output sample. Vsamp,peak is then applied to one input terminal of a subtracter 28 where it is compared to a reference voltage of a value (2×Vref) applied to the other input terminal. Preferably, Vref is equal to $2^{05} \times Vtarget$, where Vtarget is the desired RMS value of Vout. Thus in our example, Vtarget is 0.707 V and therefore 2 Vref=2 V. This example assumes that filter 32, rectifier 30 and peak detector 26 are lossless—in practice these components will exhibit some loss in which case the reference voltage 2 Vref is proportionally reduced to compensate for such loss.

The subtracter 28 produces an error voltage "Verr" equal to 2 Vref-Vsamp,peak. Thus, in our example, if the gain of the amplifier 14 has been set to provide Vout=Vtarget=0.707 V RMS, then Vsamp,peak=1 V and Verr=1 V. If the gain is too low so that the output signal Vout is less than Vtarget, Verr will exceed Vref. If the gain is too high and Vout is greater than Vtarget, then Verr will be less than Vref.

The error voltage Verr is then supplied to the inverting input terminal of a comparator 22. A ramp generator 24 supplies a ramp voltage "Vramp" to the non-inverting input terminal of comparator 22. The ramp voltage Vramp is advantageously designed to ramp from zero volts to the value 2 Vref in equal increments over a predetermined time duration of, for example, 400 μs. For example, for an output voltage of 0.707 volts the count provided by the counter will be 32. As the output of the controlled amplifier goes to 0.8 volts, the count goes down to 30. This decreased count causes the gain to decrease to the maintained and desired gain to maintain the output at 0.707 v. It is, of course, understand that while the count of 32 is used, it could be any count as for example 64, 128 depending on the number of counter stages. Comparator 22 provides at its output terminal 27, a logic HIGH output of +5 V when Vramp exceeds Verr by a predetermined amount which is dependent upon the sensitivity and hysterisis of the comparator 22. Likewise, a logic LOW output of OV will be produced when Verr exceeds Vramp by a predetermined amount. As will be explained below with reference to FIGS. 3–5, when Vramp exceeds Verr or when the 400 μs period has been reached, Vramp will be forced back to zero volts and the ramping will continue as before.

The ramp generator 24 is synchronous with a ripple counter 20 and a reset control circuit 35. Ripple counter 20 is an asynchronous counter that provides a binary count on output lines 37. The binary count is incremented with each clock pulse "clk1" received from a clock generator 54. In the illustrative embodiment, ripple counter 20 is a six bit counter with six output lines 37 to provide 64 binary counts. It is understood that more or less bits may be employed to achieve higher or lower gain resolution while trading off complexity. The ramp generator 24 also receives the clk1 pulse from clock generator 54 to enable the ramp voltage Vramp to be ramped in a synchronous relationship with the binary count of the counter 20. This is accomplished with the aid of another clock generator 52 which provides the ramp generator 24 with clock pulses "clk2" occurring at the same clock frequency as clk1 but at an offset phase. As a result, the minimum binary count of all zeros (000000) will occur when Vramp=0 V; the maximum count of all ones (111111) will occur when Vramp=Vref=1 V. At a clock frequency of, for example, 160 khz, the count will be incremented every 6.25 μs and 64 counts will occur in a 400 μs interval. In this case the slope of Vramp is 25 mV/μsec.

The binary count on output lines 37 are simultaneously supplied to a gain latch circuit 36, which circuit transfers the count to its output lines 38 under certain conditions. The gain latch 36 has an "enable" input that enables the count to be transferred whenever the applied logic voltage is HIGH. When the enable line is LOW, the count on lines 38 remains latched and new counts will not be transferred. The binary count on lines 38 are input to a multiplying D/A converter (MDAC) 17 that provides an analog control voltage "Vcontrol" proportional to the count. Multiplying D/A converters fabricated in integrated circuits are well known and thus the details of MDAC 17 will not be elaborated upon further. The control voltage Vcontrol then controls circuit parameters of the amplifier 14, such as bias voltage, to provide gain proportional to Vcontrol. In the present example, the ripple counter 20 is a six bit counter and thus, 64 counts and 64 distinct values of Vcontrol are utilized to provide 64 distinct gain values ranging from Gmin to Gmax. It is understood that the term "gain" may include gain values which are less than one so as to essentially produce attenuation rather than amplification if so desired.

The reset control circuit 35 controls the "enable" line voltage and the resetting of the ripple counter 20 and ramp generator 24. When the output voltage Vco of the comparator 22 switches to a logic HIGH state, the reset control 35 generates a reset signal "res,1" which is a logic HIGH for a short time duration, thus enabling the transfer of the present binary count on lines 37 to the output lines 38. Simultaneously, a similar reset signal "res,2" is generated and applied to a delay circuit 32 and then to the ripple counter 20 to reset the count to all zeroes. The delay is greater than the time duration of the res, 1 pulse in order to prevent the output lines 37 from being reset prior to the transfer of the count. Another reset signal "res,3" is provided to the ramp generator 24 at this time to reset Vramp to zero volts.

The reset signals res, 1, res,2 and res,3 are also generated by reset control 35 when the count reaches a predetermined maximum, which is all ones (111111) in our example. It is understood that other maximum counts may be employed for this purpose. When the maximum count is reached, the reset signals operate to transfer the maximum count to output lines 38 and reset the counter 20 and ramp generator 24 in the same manner as discussed above.

The timing diagrams of FIGS. 3–5 serve to illustrate the relationships between the aforementioned voltage levels Vout, Vtarget, Verr, Vramp, etc., and the basic operation of the automatic gain control loop of the AGC circuit 10. Referring to the graphs of FIGS. 3A and 3B, the amplifier 14 has an initial gain $G_{00}$ which is set near the middle of the amplifier 14 gain range. During a first 400 µs long time interval T1, this gain $G_{00}$ results in the RMS output voltage Vout of amplifier 14 being less than Vtarget. Vsamp,peak is then less than Vref and Verr is greater than Vref. Meanwhile, Vramp ramps from 0 V to Vref in the T1 time interval as the count is incremented from all zeroes to all ones (see FIG. 3C). As the ramp voltage rises, Vramp-Verr remains less than zero volts, as seen in FIG. 3D, and therefore, the comparator 22 output voltage Vco remains at a logic LOW—thus, there is no resetting of the count during the time interval T1. Once the maximum count has been reached at t=400 us, the maximum count is transferred to the gain latch outputs 38 causing the gain of amplifier 14 to be updated to the maximum gain Gmax. The RMS output voltage Vout then rises in accordance with the new gain Gmax in the time interval T2. Now, in FIGS. 3A–3D it is assumed that the input voltage Vin to the AGC circuit 10 is such that Vout remains below Vtarget even when the gain reaches Gmax. Thus, Vramp-Verr never reaches 0 V and the gain will remain at Gmax while the counting and ramping cycles continue.

Figure 3A:
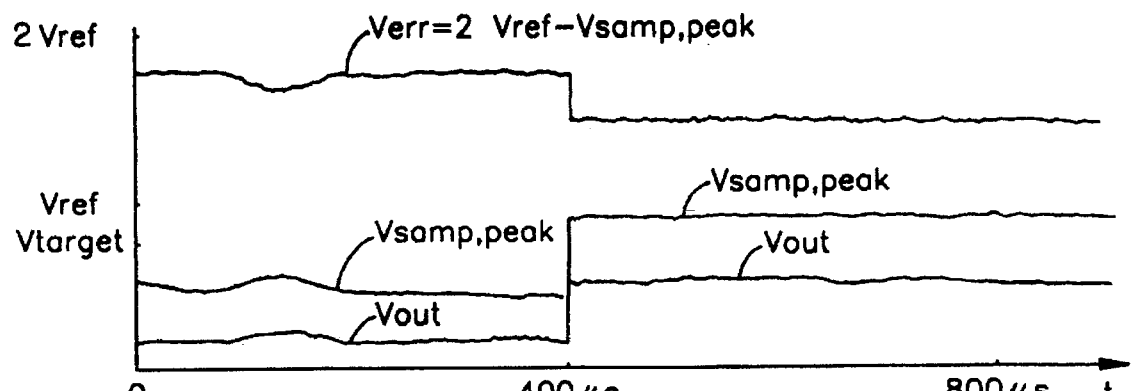
FIGS. 3A, 3B, 3C, 3D, 4A, 4B, 4C, 4D, 5A, 5B, 5C and 5D illustrate relationships between the various signal levels occurring within the circuit of FIG. 1.
Figure 3B:
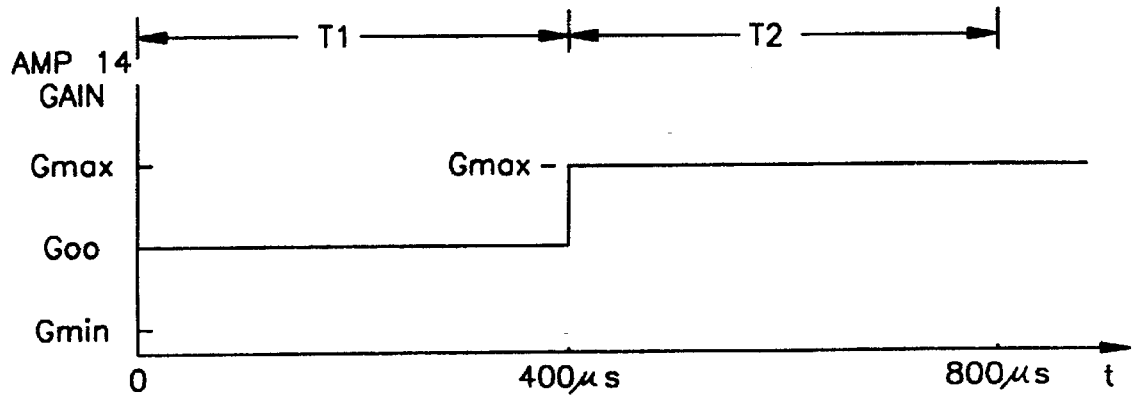
Figure 3C:
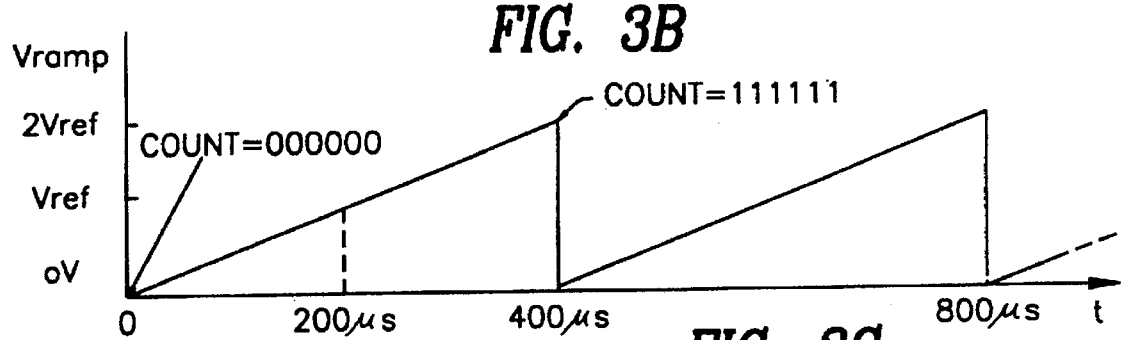
Figure 3D:
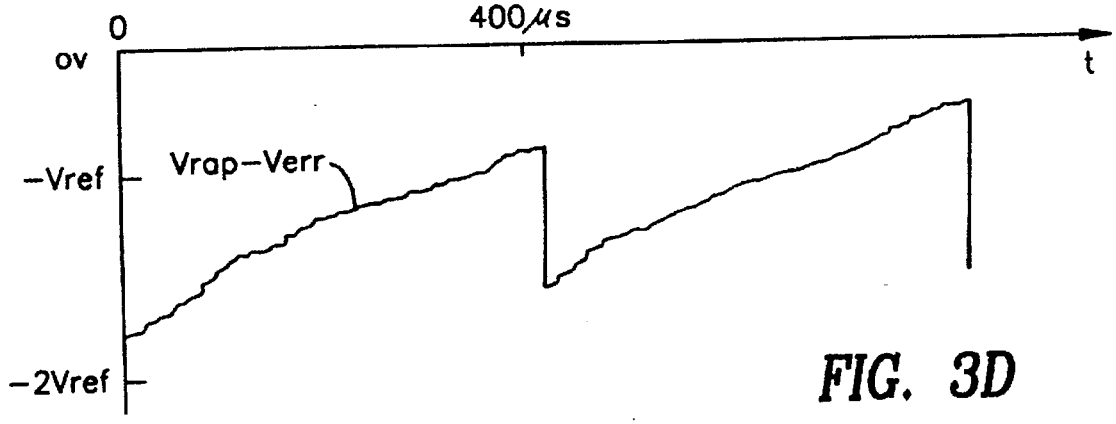
Figure 4A:
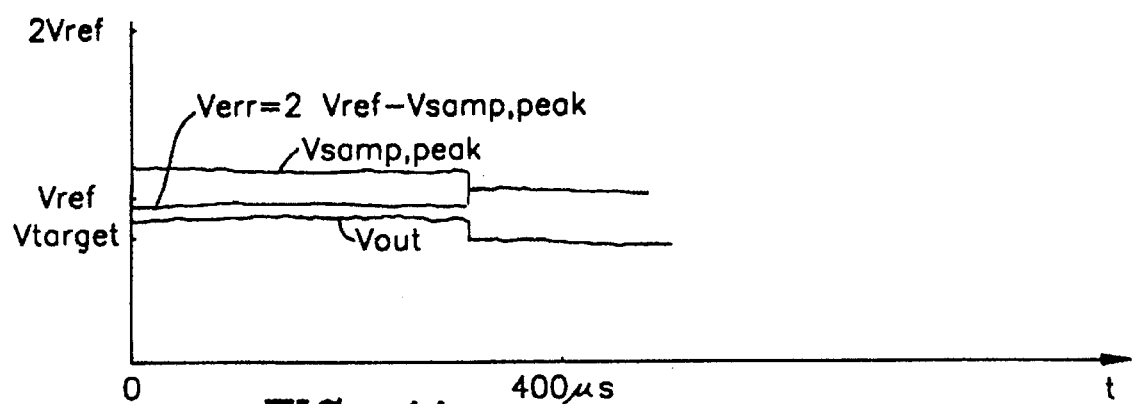
Figure 4B:
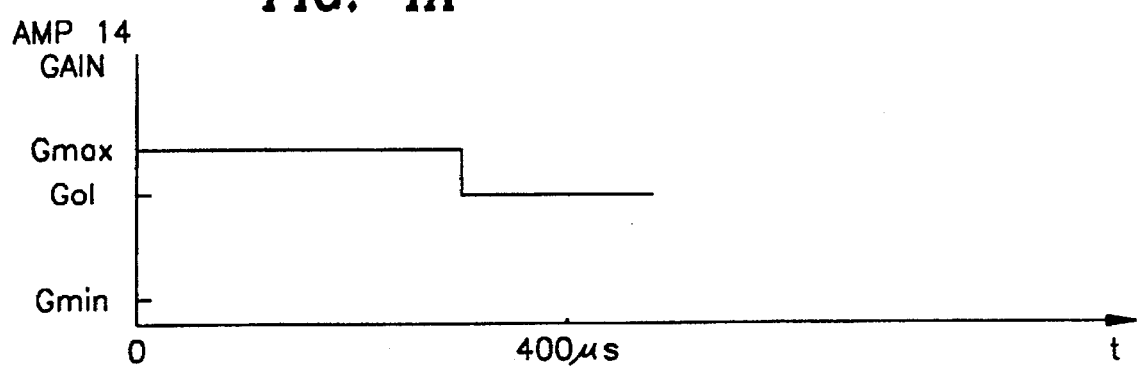
Figure 4C:
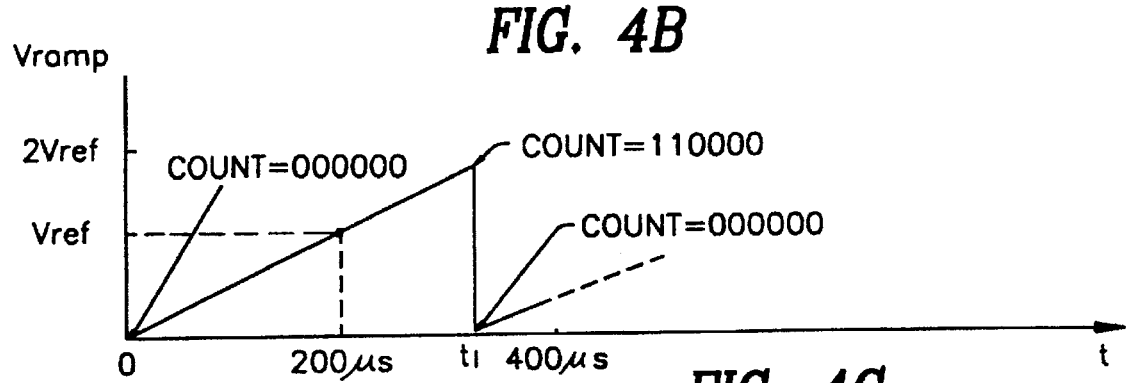
Figure 4D:
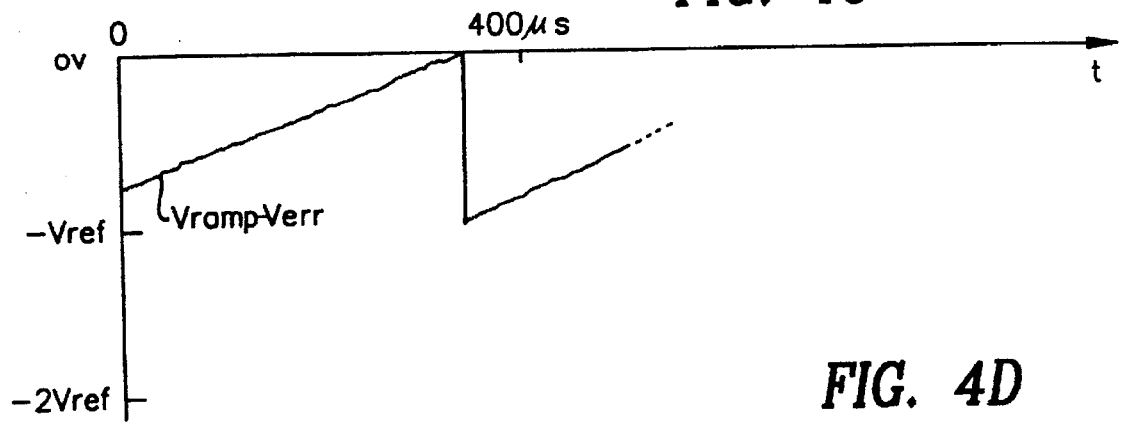
Figure 5A:
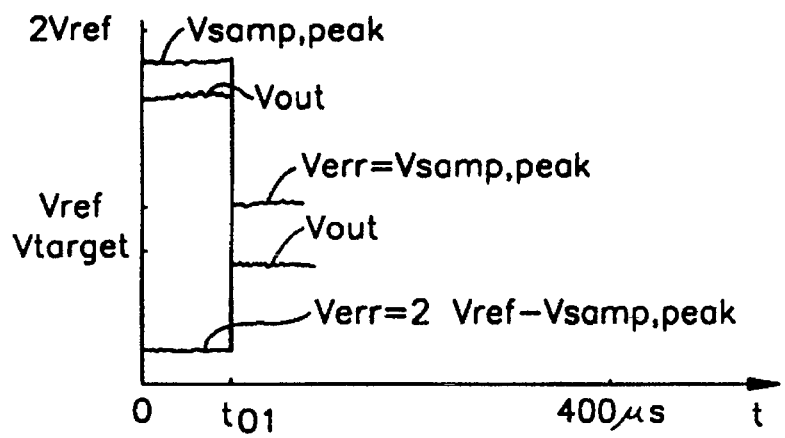
Figure 5B:
Figure 5C:
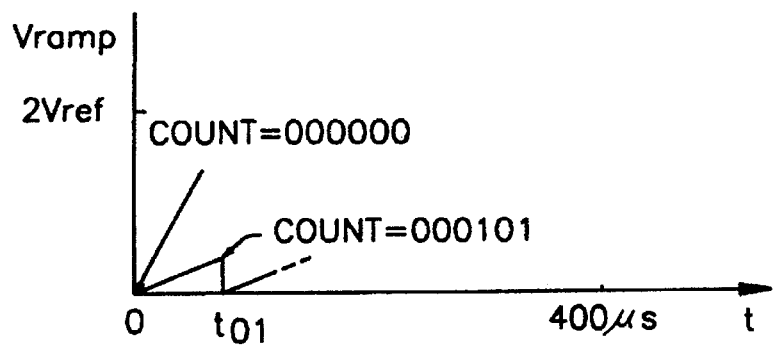
Figure 5D:
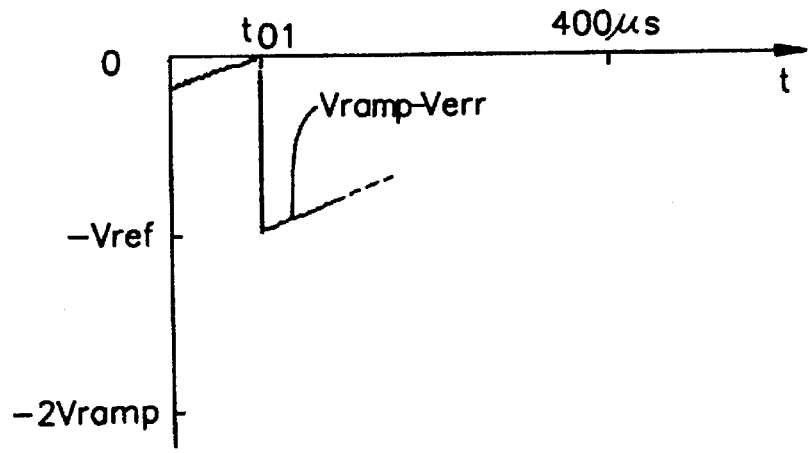

Referring now to the graphs of FIGS. 4A–4D, the input signal Vin has increased to a level such that the RMS output voltage Vout is slightly above 2 Vtarget. This causes Vsamp, peak to be slightly above Vref and for Verr to be slightly below 2 Vref. Then, as Vramp ramps to a level slightly below Vref, the difference voltage at the comparator 22 input i.e., Vramp-Verr—will exceed zero at the time t1 and the comparator output Vco will trip HIGH. At this time, a relatively high count of, for example, 110000 will become latched and the gain will be updated to a relatively high value $G_{01}$ corresponding to that count. The ramp generator 24 and ripple counter 20 will then be reset at time t1. Assume 0.707 volts is the desired output of the amplifier which corresponds to one volt peak to peak. This volume is shown in FIG. 3C as Vref and the time is shown as 200 µs. This voltage is determined by the gain to be mantained by the circuit.

In the graphs of FIGS. 5A–5D, the RMS output voltage Vout is much higher than Vtarget when the amplifier 14 gain is at Gmax. This causes the comparator 24 output voltage Vco to trip HIGH shortly after the count begins. This occurs when Vramp-Verr rises slightly above zero volts at time $t_{01}$, corresponding to a relatively low count of, for example, 000101. The amplifier 14 gain is then reduced sharply to a relatively low value $G_{11}$ corresponding to this low count. Accordingly, it is readily apparent that the updated gain values are a function of the ramping time of the ramp voltage Vramp.

Figure 6A:
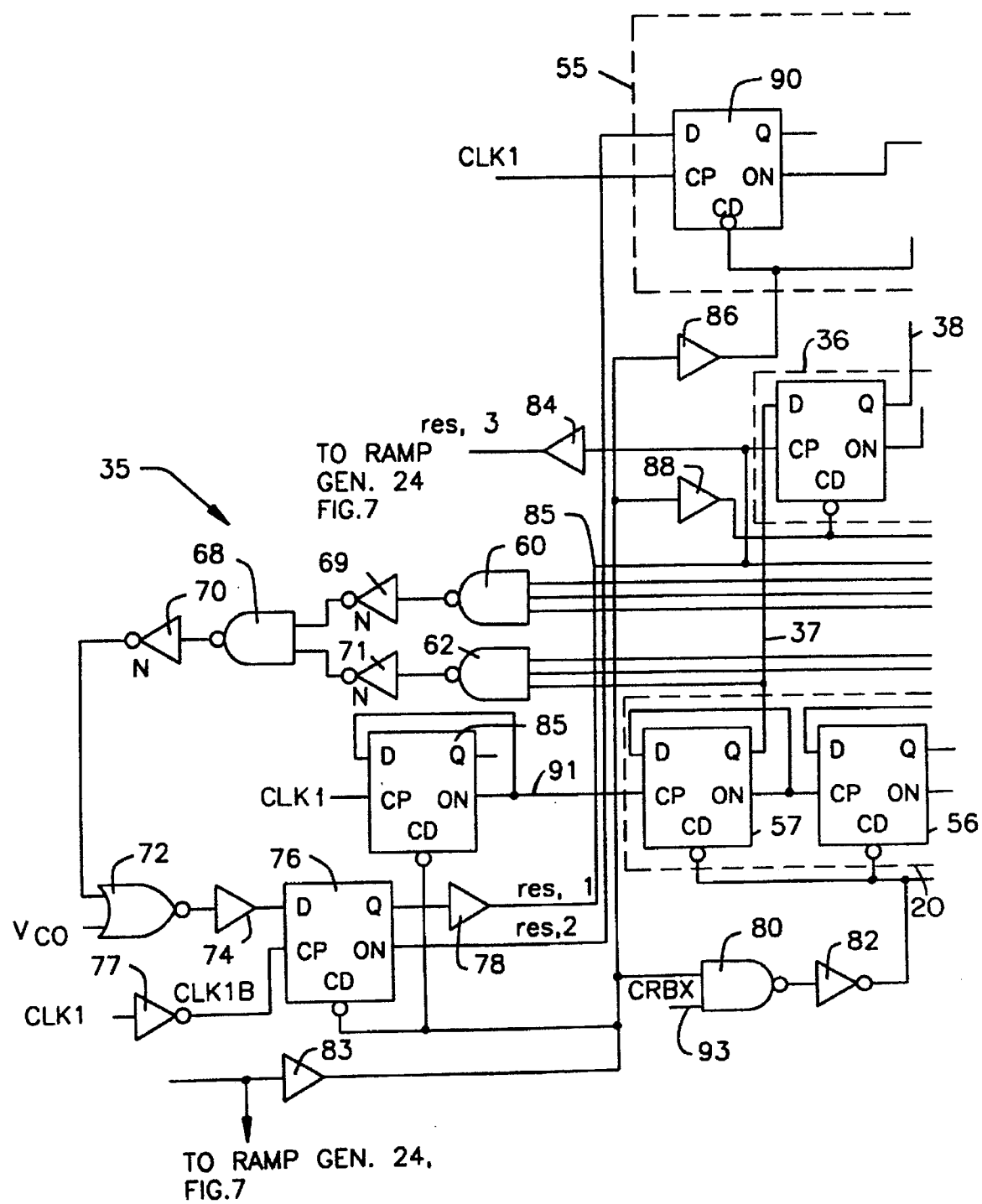
FIGS. 6A and 6B presents exemplary circuit configurations for the ripple counter, gain latch, reset control and delay elements of FIG. 1.
Figure 6B:
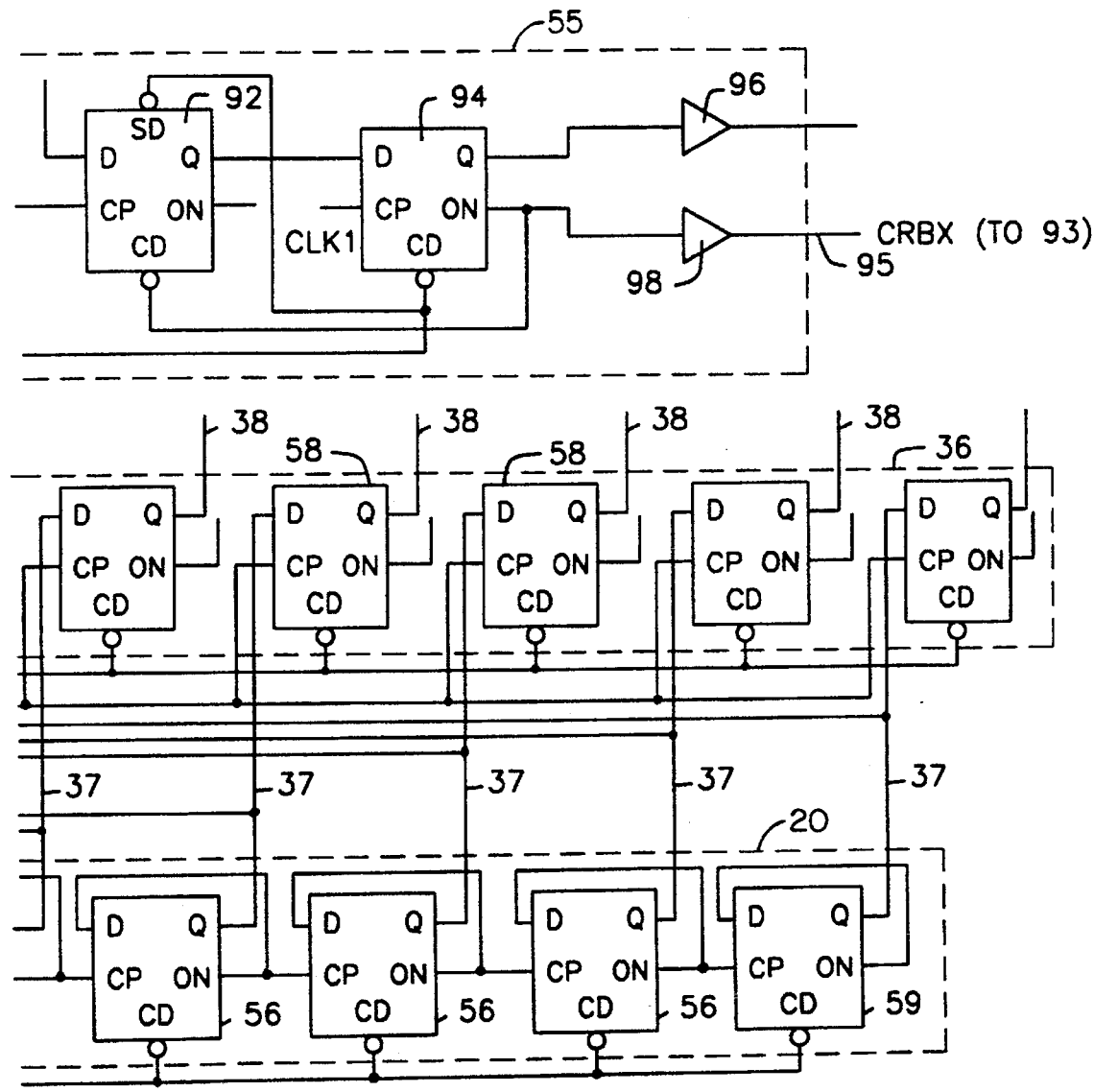

Exemplary circuit configurations for the ripple counter 20, gain latch 36, and delay element 55 are presented in FIG. 6. The circuit elements utilized therein are demarcated by the dotted lines shown; the remaining circuit elements in FIG. 6 comprise the reset control block 35 in a preferred configuration. The ripple counter 20 consists of a chain of D latch flip flops 56, 57 and 59 interconnected to provide an asynchronous count on lines 37 in a conventional manner. Each flip flop has its D input coupled to its QN (Q NOT) output and to the clock input CP of the next flip flop in the chain. The flip flop 57 receives 160 khz clock pulse inputs, which drive the count, from line 91 at its CP input. The first flip flop 57 provides the least significant bit on its Q output; the last flip flop 59 in the chain provides the most significant bit on its Q output, as is understood by those skilled in the art. Each flip flop has a reset input line designated "CD" wherein a logic level HIGH applied thereto resets each Q output to a logic LOW to reset the overall count to zero.

The gain latch circuit 36 is likewise comprised of a chain of D latch flip flops 58 each having clock inputs designated CP and reset inputs designated CD. When the clock pulse res, 1 is simultaneously applied from line 85 to the clock inputs CP of flip flops 58, the count on lines 37 is transferred via the respective Q outputs to the gain latch output lines 38.

When the count on lines 37 reaches the maximum of all ones, or when the aforementioned comparator output logic Vco trips HIGH, the reset control circuitry 35 operates to enable transfer of the count to output lines 38 and to reset the flip flops 56, 57 and 59 in the following manner. The maximum count forces the outputs of NAND gates 60 and 62 to a logic level LOW, causing the outputs of inverters 69 and 71 to be HIGH. This forces the output of NAND gate 68 low and the output of inverter 70 HIGH. (For all counts other than the maximum count, the output of inverter 70 would be LOW.) The inverter 70 output is then applied to the input of NOR gate 72, which also receives the logic level voltage Vco from comparator 22 as its other input. If the maximum count has been reached, then the output of NOR gate 72 will be LOW and the output of inverter 74 is HIGH. This causes the Q output of D latch flip flop 76 to be HIGH when a clock signal Clk1b is applied to its clock input CP. (Clock signal clk1 b is an inverted clk1 signal, produced by inverter 77). The output of buffer 78, which is tied to line 85, is then HIGH, thereby enabling the flip flops 58 to transfer the maximum count on lines 37 to the output lines 38.

Similarly, if the output logic level Vco from comparator 22 flips HIGH prior to the count reaching maximum, then the output of NOR gate 72 will be LOW. The same sequence as above results in the flip flops 58 being enabled and the then present count on lines 37 to appear on lines 38.

Simultaneously, the Q NOT output QN of D latch flip flop 76 flips LOW, which forces the QN output of flip flop 90 HIGH when the clock pulse clk1 arrives at the flip flop 90 CP input. When this occurs, a logic LOW level tied to the D input of flip flop 92 is transferred to the Q output of flip flop 92 and to the D input of flip flop 94. Then, the CLK1 pulse arriving at the flip flop 94 CP input results in its QN output being HIGH. The "CRBX" signal on line 95 (at the output of buffer 98) is then HIGH, which is applied as an input level to NAND gate 80 via line 93. Now, the "res,3" signal at the output of buffer 84 is also HIGH at this time. This signal is applied to an external latch (not shown) which forces the "res,0" signal HIGH. This results in the output of buffer 83 being HIGH, thus forcing the output of NAND gate 80 LOW, and the output of inverter 82 HIGH, thereby resetting the flip flops 56, 57 and 59. The res,0 and res,3 pulses are also provided to the ramp generator 24 (as seen in FIG. 7).

When the power to the circuitry is turned on initially, the res,0 signal is applied to buffer 83 via external circuitry (not shown) as a logic HIGH pulse of a short duration. This res,0 pulse causes all the flip flops shown in FIG. 6 with the exception of flip flop 92, to be reset to the Q=0 state. Flip flop 92 has a set input designated "SD" to which the res,0 pulse is applied, causing this flip flop to be set to the Q=1 state.

Figure 7:
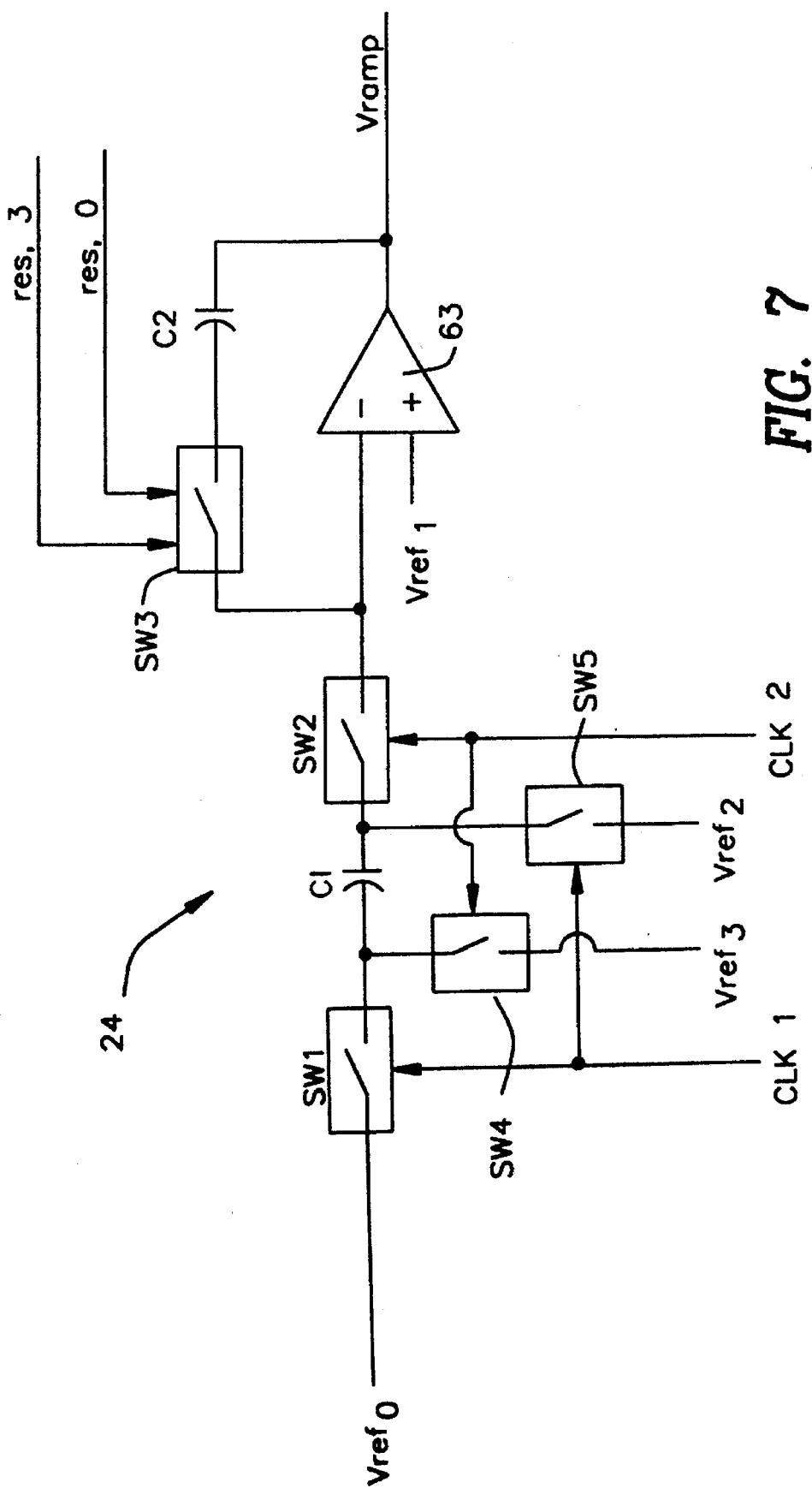
FIG. 7 shows an illustrative configuration for the ramp generator shown in FIG. 1

Referring now to FIG. 7, there is shown an illustrative circuit configuration for the ramp generator 24. The circuit employs an operational amplifier 63 with input capacitor C1 and feedback capacitor C2, which capacitors are charged and discharged at a predetermined function of time via switches sw1 to sw5 so as to produce the ramped output voltage Vramp in a conventional manner. Switches sw1 to sw5, shown in block diagram format, are preferably integrated circuit FET switches with their switching states controlled by the respective clk1, clk2, res,0 or res,3 signals. The clk1 signal controls the application of the external reference voltages Vref and Vref1 to the circuit; the clk2 signal controls the application of the external voltage Vref3 and the voltage at the negative input of op amp 63. The res,0 or res,3 signals operate to reset Vramp to zero volts to begin a new ramping interval. As will be understood by those skilled in the art, proper timing of clk1 and clk2 pulses, in conjunction with proper selection of the external voltages Vref0 to Vref3, will result in Vramp linearly ramping to a desired level within a predetermined time interval.

Thus described is an improved automatic gain control circuit employing a unique circuit configuration which is particularly useful for audio frequency applications and particularly adapted to be fabricated as an integrated circuit supported by a minimal number of external components. Because the entire AGC circuit 10 can be fabricated on a single semiconductor wafer, excellent temperature stability is realizable. Moreover, a low power dissipation design is afforded by virtue of the integrated design which is adapted to tailor out certain drive stages between otherwise discrete sections. These drive stages are eliminated simply because the drivers and loads may be fabricated within the same integrated circuit.

It will be understood that the embodiments described herein are merely exemplary and that a person of ordinary skill in the art may make many variations and modifications without departing from the spirit and scope of the invention. All such modifications are intended to be included within the scope of the invention as defined in the appended claims.

What is claimed is:

1. Apparatus for automatically controlling the gain of an amplifier having an input terminal for receiving an input signal of varying amplitude, an output terminal for providing an output voltage, and a control terminal for receiving a control voltage operable to control said gain, said apparatus comprising:

means for providing an error voltage indicative of a difference between said output voltage of said amplifier and a desired target voltage;

counting means, coupled to said amplifier control terminal, for generating digital words;

means for generating a plurality of voltage levels within a predetermined time interval with each said voltage level indicative of an associated digital word;

comparison means for comparing said plurality of voltage levels with said error voltage and for providing a control signal when said error voltage is within a predetermined range of any of said voltage levels; and means responsive to said control signal for providing said control voltage to said amplifier in accordance with said digital word whereby said gain is updated, and wherein said means responsive to said control signal is operable to terminate said counting and said generating of said voltage levels.

2. The apparatus according to claim 1 wherein said means for generating a plurality of voltage levels comprises a ramp generator for generating a linear ramp voltage that ramps from a minimum voltage to a predetermined maximum voltage as said digital words are incremented from a minimum count to a maximum count within said predetermined time interval.

3. The apparatus according to claim 2 wherein said gain is controlled to generate said output voltage substantially equal to a target root mean squared (RMS) output signal level, designated "Vtarget", and further comprising a peak detector to detect a peak level of said amplifier output voltage, said peak voltage being compared with a reference voltage to produce said error voltage.

4. The apparatus according to claim 3 wherein said error voltage is provided by a subtracter coupled to said peak detector and to said comparison means, said subtracter having first and second inputs, said peak level being applied to said first input, and said reference voltage of a value equal to $2 \times 2^{0.5} \times$Vtarget is applied to said second input, said subtracter subtracting said peak level from said reference voltage to provide said error voltage.

5. The apparatus according to claim 2 wherein said means responsive to said control signal is operable to reset the digital count to said minimum count and to reset said ramp voltage to said minimum voltage, whenever said control signal is provided.

6. The apparatus according to claim 2 wherein, in the absence of said control signal, said gain is updated to a maximum gain whenever said maximum count is reached.

7. The apparatus according to claim 2 wherein said means responsive to said control signal comprises:

a gain latch, coupled to said counting means, for receiving said digital words;

a multiplying digital to analog converter (MDAC), coupled to said amplifier and to said gain latch, said MDAC providing an analog control voltage to said amplifier in accordance with said digital words, said analog control voltage controlling circuit parameters of said amplifier and thereby controlling said gain.

8. The apparatus according to claim 7 wherein said means responsive to said control signal further comprises:

a reset control circuit, coupled to said comparison means, said ramp generator, said counting means and said gain latch, said reset control circuit providing a plurality of reset signals responsive to said control signal, said reset signals enabling transfer of a then present digital word on output lines of said counting means to output lines of said gain latch and enabling said counting means to reset said count to said minimum count and said ramp generator to reset said ramp voltage to said minimum voltage.

9. The apparatus according to claim 8 wherein said reset control circuit provides said reset signals responsive to said counting means reaching said maximum count, thereby enabling said maximum count to be transferred to said output lines of said gain latch.

10. The apparatus according to claim 1 wherein said apparatus is fabricated as an integrated circuit.

11. The apparatus according to claim 8 wherein, said counting means comprises an asynchronous counter having a first plurality of D latch flip flops each having a Q output line wherein said digital words are provided; and said gain latch comprises a second plurality of D latch flip flops each having a D input line for receiving said digital words from said first plurality of D latch flip flops, and each having a clock input line for receiving one of said reset signals from said reset control circuit to enable transfer of said digital words to Q output lines of said second plurality of D latch flip flops.

12. The apparatus according to claim 8 wherein said ramp generator comprises:

an operational amplifier having an output terminal wherein said ramp voltage is provided, a feedback loop including a first capacitor and a switch responsive to one of said reset control signals to reset said ramp voltage to zero volts;

a second capacitor coupled to an input terminal of said operational amplifier; and, means for varying voltage stored by said first capacitor as a function of time, thereby enabling said ramp voltage to be produced.

13. The apparatus according to claim 12 further comprising:

clock generating means for providing clock pulses to said counting means and to said ramp generator to synchronize said digital count with said ramp voltage; and, switch means, coupled to said second capacitor, for receiving said clock pulses to enable said voltage stored by said second capacitor to be varied as a function of time.

14. The apparatus according to claim 4 wherein said ramp generating means is adapted to ramp said ramp voltage from zero volts to one half of said reference voltage as said digital count is incremented from a minimum count to a maximum count within a predetermined time interval; and, wherein said comparison means comprises a comparator having inverting and noninverting input terminals and an output terminal, said ramp voltage being applied to said noninverting input terminal, said error voltage being applied to said inverting input terminal, said comparator providing said control signal on said output terminal as a given logic level when said ramp voltage exceeds said error voltage.

15. The apparatus according to claim 3 further comprising:

a sample and hold circuit coupled to said amplifier output for providing an output voltage sample;

a low pass filter coupled to said sample and hold circuit for low pass filtering of said output voltage sample;

a rectifier having an input coupled to said low pass filter and an output coupled to said peak detector for providing a rectified output voltage sample to said peak detector.

16. Apparatus for amplifying an input signal of varying amplitude to produce an output signal, comprising:

range control means for providing a digital control word indicative of an amplitude range that said input signal is within;

preamplification means, coupled to said range control means, for amplifying said input signal at a gain corresponding to said digital control word to produce an intermediate amplified signal;

an output amplifier having an input terminal for receiving said intermediate amplified signal, an output terminal for providing said output signal, and a control terminal for receiving a control voltage operable to control said gain;

means for providing an error voltage indicative of a difference between said output signal and a desired target voltage;

counting means for generating digital words;

means for generating a plurality of voltage levels within a predetermined time interval with each said voltage level indicative of an associated digital word;

comparison means for comparing said plurality of voltage levels with said error voltage and for providing a control signal when said error voltage is within a predetermined range of any of said voltage levels; and means responsive to said control signal for providing said control voltage to said amplifier in accordance with said digital word whereby said gain is updated to provide said output signal at a substantially constant RMS amplitude, and wherein said means responsive to said control signal is operable to terminate said counting and said generating of said voltage levels.

17. The apparatus according to claim 16 wherein said range control means comprises:

a peak detector for providing a peak signal indicative of the peak level of said input signal;

an analog to digital (A/D) converter coupled to said peak detector and to said preamplification means, for converting said peak signal into said digital control word, said digital control word being of a predetermined number of bits, with each word corresponding to a given amplitude range of said input signal.

18. The apparatus according to claim 16 wherein said apparatus is fabricated as an integrated circuit.

19. Method for automatically controlling gain of an amplifier producing an output signal in response to a varying input signal level to said amplifier, comprising the steps of:

providing an error voltage indicative of a difference between said output signal of said amplifier and a desired target voltage;

generating a digital count;

generating a plurality of voltage levels according to said digital count;

providing a control signal in accordance with the difference between said voltage levels and said error voltage; and updating the gain of said amplifier, responsive to said control signal, to a value corresponding to said digital count.

20. The method according to claim 19 further comprising the steps of:

providing a digital control word indicative of an amplitude range that said input signal is within; and preamplifying said input signal at a gain corresponding to said digital control word.

* * * * *